United States Patent [19]

Groves et al.

[11] Patent Number: 6,054,367
[45] Date of Patent: Apr. 25, 2000

[54] ION IMPLANT OF THE MOAT ENCROACHMENT REGION OF A LOCOS FIELD ISOLATION TO INCREASE THE RADIATION HARDNESS

[75] Inventors: Emily A. Groves, Sachse; Wayne E. Bailey, Garland; Douglas E. Paradis, Richardson; Homer K. Cheung, Dallas, all of Tex.

[73] Assignee: Texas Instruments Incorporated, Dallas, Tex.

[21] Appl. No.: 08/127,707

[22] Filed: Sep. 28, 1993

Related U.S. Application Data

[63] Continuation of application No. 07/850,643, Mar. 13, 1992, abandoned.

[51] Int. Cl.⁷ .................................................. H01L 21/762
[52] U.S. Cl. .......................................... 438/450; 438/451
[58] Field of Search ................................... 437/28, 37, 70; 148/DIG. 85, DIG. 86, DIG. 117; 438/449, 450, 451, FOR 229

[56] References Cited

U.S. PATENT DOCUMENTS

| | | |
|---|---|---|
| 4,357,747 | 11/1982 | Kurakami et al. . |
| 4,562,639 | 1/1986 | McElroy ..................................... 437/70 |
| 4,894,693 | 1/1990 | Tigeaar et al. . |
| 5,240,874 | 8/1993 | Roberts . |
| 5,384,279 | 1/1995 | Stolmeijer et al. . |
| 5,468,677 | 11/1995 | Jun . |
| 5,688,701 | 11/1997 | Kobayashi . |
| 5,773,336 | 6/1998 | Gu . |
| 5,789,287 | 8/1998 | Lee . |

FOREIGN PATENT DOCUMENTS

| | | |
|---|---|---|
| 5893279 | 6/1983 | Japan . |
| 60130136 | 7/1985 | Japan . |
| 6295847 | 5/1987 | Japan . |
| 62126651 | 6/1987 | Japan . |
| 2126645 | 5/1990 | Japan . |

OTHER PUBLICATIONS

Translation of Japanese Patent 60–130136, Jul. 1985.
Translation of Japanese Patent 62–126651, Jun. 1987.
Citation of abstract of Japanese Patent 60–130136, Inpadoc database, Nov. 1985.
Citation of abstract of Japanese Patent 62–126651, Nov. 1987.

*Primary Examiner*—George Fourson
*Attorney, Agent, or Firm*—Wade James Brady, III; Frederick J. Telecky, Jr.

[57] ABSTRACT

A method of forming a semiconductor device and the device, the method comprising the steps of providing a silicon substrate of predetermined conductivity type having a layer of silicon oxide with a first mask thereon, implanting a first impurity of the predetermined conductivity type into the substrate in unmasked regions of the substrate, masking the substrate except for a small region immediately adjacent the first mask with a second mask, implanting a second impurity of the predetermined conductivity type into the substrate in the unmasked regions of the substrate to cause some of the impurity to extend in the substrate beneath the first mask, removing the second mask, oxidizing the substrate with the first mask thereon to form a bird's beak extending beneath the first mask with the impurities extending along the bird's beak both beneath and external to the first mask and completing fabrication of a semiconductor device on substrate. The device is a semiconductor device having a silicon substrate of predetermined conductivity type with a semiconductor device structure therein, and a bird's beak region on the substrate wherein the substrate has a higher level of impurity of the predetermined conductivity type along and directly beneath the bird's beak region than in the bulk of the substrate.

11 Claims, 2 Drawing Sheets

ION IMPLANT OF THE MOAT ENCROACHMENT REGION OF A LOCOS FIELD ISOLATION TO INCREASE THE RADIATION HARDNESS

This application is a Continuation, of application Ser. No. 07/850,643, filed Mar. 13, 1992 now abandoned.

BACKGROUND OF THE INVENTION

1. Field of the Invention

This invention relates to a method of increasing the radiation hardness of the bird's beak region of a semiconductor device and, more specifically, to an NMOS semiconductor device having implanted impurity extending to the edge of the bird's beak region.

2. Brief Description of the Prior Art

It is well known that most CMOS processes using local oxidation of silicon (LOCOS) for field isolation are not very tolerant to radiation. For example, NMOS transistors processed on the 4/3 FPA LINCMOS process show excessive leakage at less than 20 Krad (Si) total dose. There are three transistor regions that are susceptible to radiation induced leakage, these being the gate or active region, the field isolation region and the moat encroachment or bird's beak region. When a MOS device is exposed to ionizing radiation, electron-hole pairs are generated in the oxide, resulting in oxide trapped charge and interface states. The problem becomes more acute for focal plane array (FPA) readout integrated circuits operating at cryogenic temperatures where little annealing of trap charge takes place. The net result of the above described effect is to cause a negative shift in the gate, field and bird's beak voltage thresholds in NMOS devices. Leakage currents can result from these threshold shifts if the threshold voltage of a thin gate falls to an unacceptably low value or surface inversion occurs in the field oxide or bird's beak region. PMOS transistors rarely show any leakage after irradiation since the negative threshold voltage shifts due to radiation increasing the already negative threshold voltages, making it more difficult to turn the PMOS transistors on.

Radiation results of NMOS subthreshold transistors at cryogenic temperatures have shown that inversion in the bird's beak region is the main reason for NMOS transistor leakage up to about 20 Krad (Si). The bird's beak region has a lower threshold voltage than the field oxide because the oxide is thinner than the field oxide and the channel stop implant used to increase the field threshold voltage does not reach under the nitride or, consequently, under the portion of the bird's beak disposed under the nitride.

There is accordingly a necessity to improve the radiation hardness of the birds's beak region of CMOS semiconductor devices and particularly the NMOS component thereof.

SUMMARY OF THE INVENTION

In accordance with the present invention, there is provided a method and device whereby the radiation hardness of the bird's beak region is increased. This is accomplished by increasing the threshold voltage of the parasitic transistor formed when an inversion layer occurs due to radiation in the substrate under the bird's beak region. A higher pre-radiation threshold voltage will tolerate larger threshold voltage shifts and leakage will not occur until higher total doses of radiation are provided. An implant mask process using an encroachment pattern is utilized which allows ion implanting into all or a portion of the isolation region and the area where the isolation will encroach into the non-isolation regions, and an ion implant providing additional channel stop doping in and to substantially the edge of the bird's beak (i.e., encroachment) region to raise the impurity concentration before field isolation. Increasing the impurity concentration in the substrate under the bird's beak region increases the threshold voltage of this area and improves the radiation tolerance of the device.

The above is accomplished by providing a silicon substrate, preferably p-type, having a layer of silicon oxide with a first mask thereon, preferably silicon nitride. A second mask of photosensitive material is used to define a region that includes all or a portion of the region unmasked by the first mask and a small region extending into the first masking layer by a region approximately equal to the bird's beak region that will be formed during the isolation process. An impurity of the same conductivity type as the substrate is then ion implanted into the substrate in the masked regions defined by the second mask to cause some of the impurity to extend into the substrate beneath the first mask. After removal of the second mask, the substrate is oxidized with the first mask thereon to form a bird's beak extending beneath the first mask with the impurities extending along the bird's beak both beneath and external to the first mask. Then standard fabrication steps required to complete the device are performed.

An alternative method is to ion implant into the substrate impurities of the same conductivity type as the substrate using the second mask described above prior to placing the first masking material and pattern onto the substrate. The first mask and pattern described above is then placed on the substrate and the substrate is oxidized, forming the bird's beak and impurity concentration gradients described above.

DESCRIPTION OF THE PREFERRED EMBODIMENTS

Figure 1:
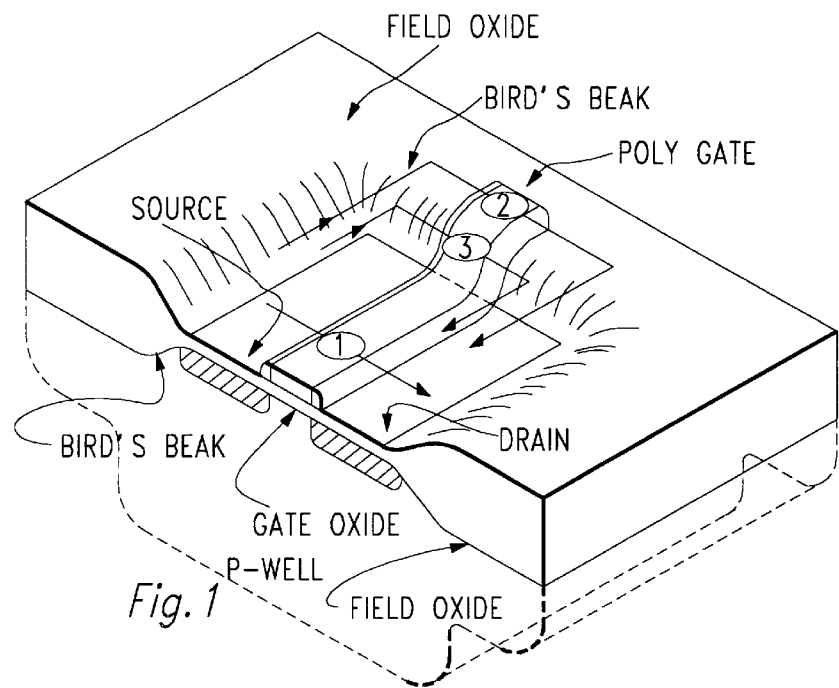
FIG. 1 is a cross-sectional view of an NMOS transistor showing the three radiation-induced leakage paths.

Referring first to FIG. 1, there is shown a cross-sectional view of a typical NMOS transistor which can be a part of a CMOS device (the PMOS transistor not being shown) showing the three radiation induced leakage paths, these being the field oxide layer 1, the gate oxide 2 and the bird's beak 3. As stated above, it is the intention in accordance with the present invention to increase the implant in the bird's beak region to improve the radiation hardness thereof.

Figure 2A:
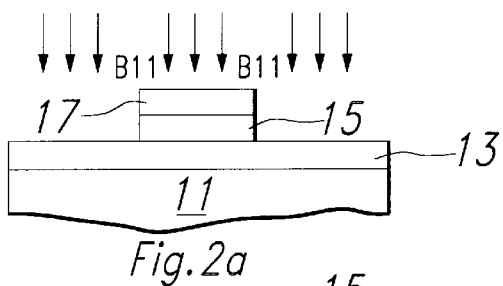
FIGS. 2a to 2e provide a first embodiment of a process flow for the process involved in forming a semiconductor device in accordance with the present invention.
Figure 2B:
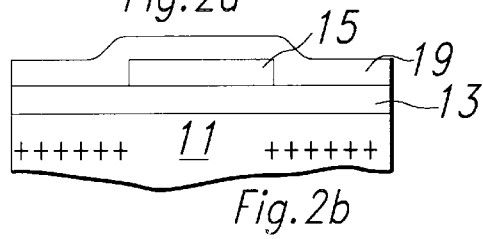
Figure 2D:
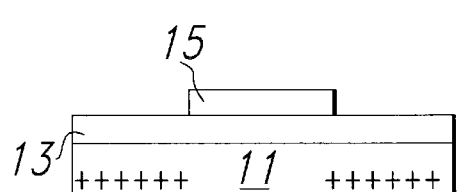
Figure 2C:
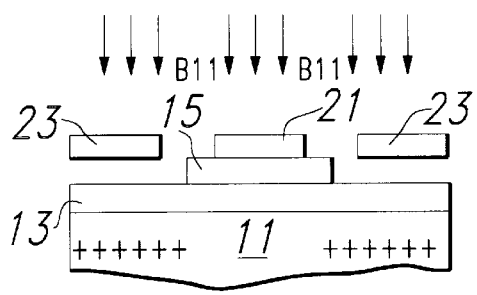
Figure 2E:
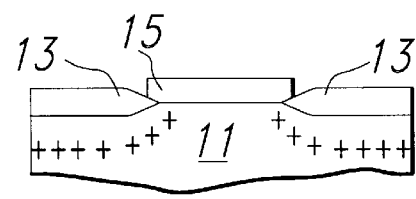

Referring now to FIGS. 2a through 2e there is provided a process flow for fabrication of a semiconductor device in accordance with the present invention. There is shown a moat encroachment mask process in accordance with the present invention for providing the desired radiation hardness in the bird's beak region. FIG. 2a shows the portion of a p-type silicon wafer 11 whereat the bird's beak region of a transistor will be formed. An oxide layer 13 having a thickness of about 500 Å is formed over the silicon region in standard manner, such as, for example, by thermal oxidation of the silicon or chemical vapor deposition (CVD). A silicon nitride layer 15 is patterned in standard manner with resist layer 17 thereover over what will be the bird's beak region and the active or moat region being fabricated and a donor impurity, preferably boron B11, is then implanted into the silicon wafer 11 in the regions thereof unmasked by the silicon nitride layer 15 and resist layer 17 thereover as shown in FIG. 2b. As also shown in FIG. 2b, the resist layer 17 is removed and a second resist layer 19 is formed over the entire wafer. The second resist layer 19 is patterned to leave a portion thereof 21 over the silicon nitride layer 15 to expose the edge portions of the silicon nitride and is also retained in a region 23 spaced from the edge of the nitride layer to leave a space between the resist portions 21 and 23 which extends over the silicon nitride layer 15 and beyond the edge of the silicon nitride. A second dose of donor impurity, preferably the same impurity as in the first dose or boron B11, is then implanted into the silicon wafer 11 at the exposed regions thereof between the regions of resist 21 and 23 and through the exposed edge portions of the nitride layer 15 to extend the ion implant region in the wafer 11 beneath the nitride layer 15 as shown in FIG. 2c. The resist regions 21 and 23 are then stripped in standard manner as shown in FIG. 2d and field oxidation takes place in standard manner with the silicon nitride layer 15 in place. As can be seen in FIG. 2e, the portion of the oxide layer 13 unmasked by the silicon nitride layer 15 is enlarged due to the increased volume of the silicon oxide formed from the silicon wafer 11 thereunder. The portion of the silicon wafer 11 masked by the silicon nitride layer 15 oxidizes at a much slower rate and a portion of the wafer 11 extending from beneath an edge region of the silicon nitride layer to an adjacent portion of the unmasked region tapers gradually to the thickness of the field oxide and is the bird's beak region. Also, a layer thin layer of oxide is formed beneath the nitride layer 15. It can be seen that the implanted ions continue to rest along the field oxide conformal to the entire bird's beak region to provide the desired radiation hardness.

Figure 3A:
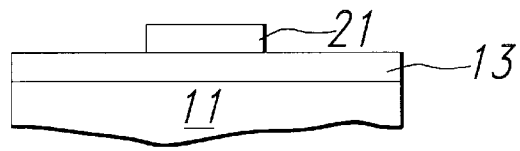
FIGS. 3a to 3d provide a second embodiment of a process flow for the process involved in forming a semiconductor device in accordance with the present invention.
Figure 3B:
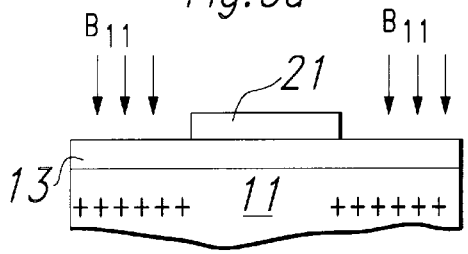
Figure 3C:
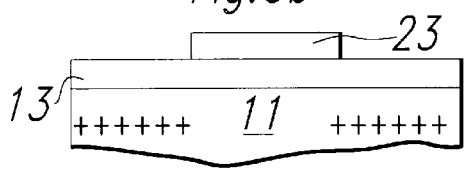
Figure 3D:
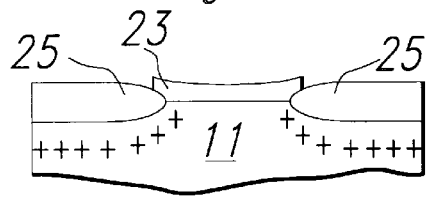

Referring now to FIGS. 3a to 3d, there is shown a second process flow for achieving the above described goal of having added impurity under the bird's beak. There is provided the substrate 11 with oxide layer 13 thereon. A resist layer 21 is patterned over a portion of the oxide layer 13 to the end of the bird's beak to be formed as shown in FIG. 3a and boron B11 is implanted into the substrate 11 as shown in FIG. 3b. The resist layer 21 is then removed and a nitride layer 23 is deposited, patterned and etched in the region from which the resist 21 was removed, the layer 23 extending outwardly over a portion of the implanted boron as can be seen in FIG. 3c. The structure is then oxidized to provide the field oxide 25 which extends under the nitride layer 23 with the implanted boron extending to the end of the bird's beak as can be seen in FIG. 3d. Standard processing is then continued to provide the desired completed semiconductor device wherein the nitride layer 23 is removed from over the moat region and processing takes place in the moat region in standard manner.

Figure 4A:
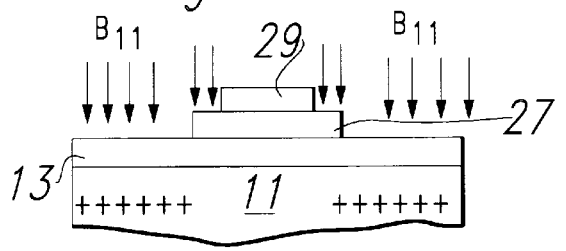
FIGS. 4a and 4b provide a third embodiment of a process flow for the process involved in forming a semiconductor device in accordance with the present invention.
Figure 4B:
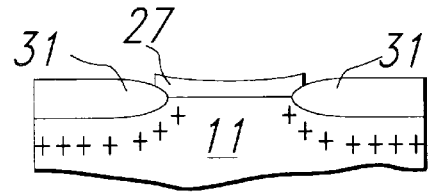

Referring now to FIGS. 4a and 4b, there is shown a third process flow for fabrication of a semiconductor device in accordance with the present invention wherein there is provided the substrate 11 with oxide layer 13 thereon. A nitride layer 27 is patterned over a portion of the oxide layer and a resist layer 29 is patterned over a portion of the nitride layer coincident with the bird's beak to be formed extending essentially to the edge of the resist layer. Boron B11 is then implanted into the substrate 11 both around the nitride layer 27 and through the exposed portion of the nitride layer as shown in FIG. 4a. The resist layer 29 is then removed and the field oxide 31 is formed in standard manner, extending under a portion of the nitride layer 27 with implanted boron extending to the edge of the bird's beak. The nitride layer 27 is then removed from the moat region and processing is completed in the moat region in standard manner.

Figure 5A:
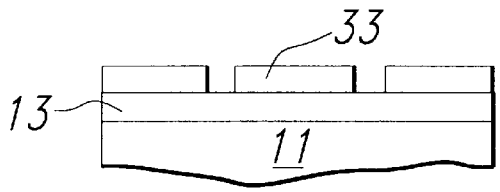
FIGS. 5a to 5e provide a fourth embodiment of a process flow for the process involved in forming a semiconductor device in accordance with the present invention.
Figure 5B:
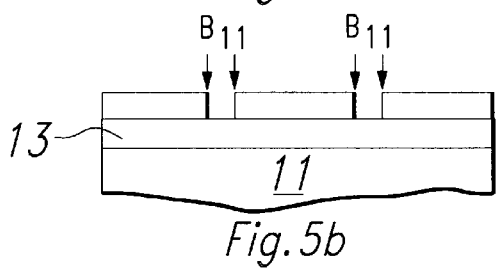
Figure 5C:
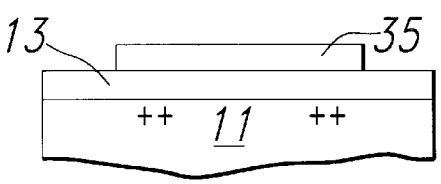
Figure 5D:
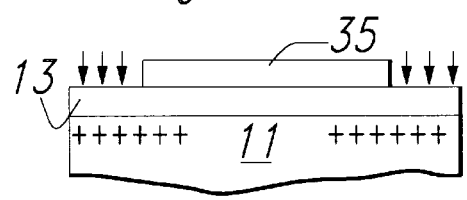
Figure 5E:
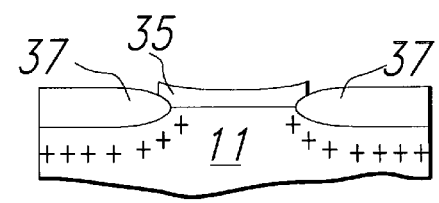

Referring now to FIGS. 5a to 5e, there is shown a fourth embodiment of a process flow for fabrication of a semiconductor device in accordance with the present invention. There is provided the silicon substrate 11 with oxide layer 13 thereover as before. A resist edge mask 33 is provided having apertures therein at the regions whereat the bird's beak will be formed as shown in FIG. 5a. Boron B11 is implanted through the mask 33 as shown in FIG. 5b and the mask 33 is removed. A nitride layer 35 is then deposited over the moat region which includes the region into which the boron has previously been implanted as shown in FIG. 5c and boron B11 is then implanted into the exposed portions of the substrate as shown in FIG. 5d. The field oxide 37 is then grown in standard manner as above with the bird's beak region extending under the nitride layer 35 and the implanted boron extending to the end of the bird's beak region as shown in FIG. 5e. The device is then completed by processing in standard manner.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of forming a semiconductor device comprising the steps of:

(a) providing a silicon substrate of a first conductivity type having an electrically insulating layer thereon with a first mask over said electrically insulating layer;

(b) performing a first implantation step by implanting an impurity of said first conductivity type into said substrate in unmasked regions of said substrate;

(c) masking said substrate except for a region immediately adjacent said first mask with a second mask;

(d) implanting an impurity of said first conductivity type into said substrate in the unmasked regions of said substrate immediately adjacent said first mask to provide a region of higher impurity concentration in said unmasked region of said substrate immediately adjacent said first mask;

(e) causing some of said impurity of said first conductivity type to extend laterally in said substrate beneath said first mask;

(f) removing said second mask;

(g) oxidizing the exposed portion of said substrate with said first mask thereon to form an electrically insulating layer on said substrate terminating in a bird's beak region extending beneath said first mask with said region of higher impurity concentration of impurities extending along said bird's beak both beneath and external to said first mask; and (h) completing fabrication of a semiconductor device on said substrate.

2. The method of claim 1 wherein steps (b) and (d) each include the step of providing boron B11 and said steps of implanting comprise implanting said boron B11.

3. The method of claim 1 wherein said substrate is p-type and said first and second impurities are p-type.

4. The method of claim 1 wherein said first mask is silicon nitride.

5. The method of claim 3 wherein said first mask is silicon nitride.

6. A method of forming a semiconductor device comprising the steps of:

(a) providing a silicon substrate of a first conductivity type having an electrically insulating layer thereon;

(b) masking a first region of said substrate in which the moat region of said semiconductor device is being fabricated;

(c) implanting an impurity of said first conductivity type into a second region of said substrate external to said first region;

(d) implanting an impurity of said first conductivity type into said substrate in a portion of said second region immediately adjacent and contacting said first region to provide a region of higher impurity concentration in said portion of said second region immediately adjacent and contacting said first region;

(e) causing some of said first conductivity type impurity to extend laterally in said substrate beneath said mask;

(f) oxidizing the exposed portion of said substrate with said mask thereon to form an electrically insulating layer on said substrate terminating in a bird's beak region extending beneath said mask with said region of higher impurity concentration of impurities extending along said bird's beak both beneath and external to said mask; and (g) completing fabrication of a semiconductor device on said substrate.

7. The method of claim 6 wherein steps (c) and (d) each include the step of providing boron B11 and said steps of implanting comprise implanting said boron B11.

8. The method of claim 6 wherein said step of providing a substrate includes the step of providing a p-type substrate and wherein steps (c) and (d) each include the step of providing boron B11 and said steps of implanting comprise implanting said boron B11.

9. The method of claim 6 wherein said first mask is silicon nitride.

10. A method of forming a semiconductor device comprising the steps of:

(a) providing a silicon substrate of a first conductivity type;

(b) forming an electrically insulating layer on said substrate having a bird's beak region at an edge portion thereof;

(c) implanting ions of said first conductivity type into said substrate and beneath said electrically insulating layer, the concentration of said ions of said first conductivity type being greater beneath said bird's beak region than beneath the remainder of the portion of said substrate beneath said electrically insulating layer; and (d) completing fabrication of said semiconductor device in the region of said substrate immediately adjacent said bird's beak region;

(e) further including the step of providing a layer of silicon nitride extending over a portion of said bird's beak, said implanted ions extending beneath said layer of silicon nitride.

11. The method of claim 10 wherein said substrate is p-type.

* * * * *